(12) United States Patent
Wei et al.

(10) Patent No.: US 10,327,356 B2
(45) Date of Patent: Jun. 18, 2019

(54) ELECTRONIC APPARATUS

(71) Applicant: FUJITSU LIMITED, Kawasaki-shi, Kanagawa (JP)

(72) Inventors: Jie Wei, Hachioji (JP); Keizou Takemura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/966,006

(22) Filed: Apr. 30, 2018

(65) Prior Publication Data

US 2018/0332735 A1    Nov. 15, 2018

(30) Foreign Application Priority Data

May 15, 2017    (JP) ................. 2017-096459

(51) Int. Cl.
*H05K 7/20*    (2006.01)
*H05K 5/00*    (2006.01)

(52) U.S. Cl.
CPC .......... *H05K 7/20263* (2013.01); *H05K 5/00* (2013.01); *H05K 7/20254* (2013.01); *H05K 7/20418* (2013.01); *H05K 7/20445* (2013.01)

(58) Field of Classification Search
CPC .......... H05K 7/20145; H05K 7/20154; H05K 7/20163; H05K 7/20181; H05K 7/20418; H05K 7/20427
See application file for complete search history.

(56) References Cited

U.S. PATENT DOCUMENTS

| | | | | |
|---|---|---|---|---|
| 3,737,728 A | * | 6/1973 | Austin ............... | H05K 7/20154 174/16.3 |
| 4,712,159 A | * | 12/1987 | Clemens ............ | H01L 23/4093 165/80.3 |
| 4,906,194 A | * | 3/1990 | Grabbe ............... | H05K 7/1069 439/607.07 |
| 4,914,551 A | * | 4/1990 | Anschel ............. | H01L 23/3675 257/713 |
| 5,123,849 A | * | 6/1992 | Deak .................... | H01R 12/57 439/591 |
| 5,473,510 A | * | 12/1995 | Dozier, II .......... | H01L 23/4006 174/548 |
| 5,833,472 A | * | 11/1998 | Bright ................. | H05K 7/1061 439/70 |
| 5,883,782 A | * | 3/1999 | Thurston ............ | H01L 23/4006 257/718 |
| 5,901,039 A | * | 5/1999 | Dehaine ............. | H01L 23/4006 257/719 |

(Continued)

FOREIGN PATENT DOCUMENTS

| | | |
|---|---|---|
| JP | 2004-363525 | 12/2004 |
| JP | 2009-152427 | 7/2009 |
| JP | 2011-159704 | 8/2011 |

*Primary Examiner* — Adrian S Wilson
(74) *Attorney, Agent, or Firm* — Fujitsu Patent Center

(57) ABSTRACT

An electronic apparatus includes a substrate, a heat radiating member which faces the substrate with a gap therebetween, a fixing assembly which fixes the heat radiating member to the substrate, a heat transfer plate disposed on a side of the substrate with respect to the heat radiating member, and a thermal bonding material which is interposed between the heat radiating member and the heat transfer plate, and has elasticity, wherein an electronic device is inserted between the substrate and the heat transfer plate.

14 Claims, 3 Drawing Sheets

(56) References Cited

U.S. PATENT DOCUMENTS

| | | | | |
|---|---|---|---|---|
| 6,046,905 A * | 4/2000 | Nelson | G06F 1/184 | 257/E23.086 |
| 6,074,219 A * | 6/2000 | Tustaniwskyj | H05K 3/325 | 439/66 |
| 6,241,005 B1 * | 6/2001 | Risca | F28F 13/00 | 165/185 |
| 6,245,186 B1 * | 6/2001 | Alcoe | H01L 21/563 | 156/297 |
| 6,411,513 B1 * | 6/2002 | Bedard | H01L 23/3672 | 165/185 |
| 6,903,941 B2 * | 6/2005 | Paola | H05K 7/1084 | 361/790 |
| 7,200,006 B2 * | 4/2007 | Farrow | H01L 23/42 | 257/717 |
| 7,209,354 B2 * | 4/2007 | Wu | H01L 23/4093 | 257/706 |
| 7,646,608 B2 * | 1/2010 | Thompson | H01L 23/433 | 165/185 |
| 8,289,712 B2 * | 10/2012 | Holahan | H01L 23/433 | 361/709 |
| 2004/0052052 A1 * | 3/2004 | Rivera | H01L 23/427 | 361/700 |
| 2007/0201206 A1 * | 8/2007 | Farrow | H01L 23/4006 | 361/700 |
| 2007/0268668 A1 * | 11/2007 | Lin | F28D 15/00 | 361/697 |
| 2009/0296350 A1 | 12/2009 | Oki et al. | | |
| 2010/0208422 A1 * | 8/2010 | Tai | G06F 1/20 | 361/679.31 |
| 2013/0120932 A1 * | 5/2013 | Tan | G06F 1/20 | 361/679.54 |
| 2017/0231113 A1 * | 8/2017 | Anderl | G06F 1/20 | |

* cited by examiner

US 10,327,356 B2

ELECTRONIC APPARATUS

CROSS-REFERENCE TO RELATED APPLICATION

This application is based upon and claims the benefit of priority of the prior Japanese Patent Application No. 2017-96459, filed on May 15, 2017, the entire contents of which are incorporated herein by reference.

FIELD

The embodiments discussed herein are related to an electronic apparatus.

BACKGROUND

In the related art, there is an electronic apparatus provided with an electronic device which is insertable into and removable from a housing, and a heat radiating member which thermally comes into contact with the electronic device in a state in which the electronic device is inserted into the housing. In addition, in the electronic apparatus of such a type, there is an electronic apparatus in which the heat radiating member can move toward a substrate, which is provided in the housing, in a direction facing the substrate, and the heat radiating member is urged toward the substrate by an elastic member.

In such an electronic apparatus, when the electronic device is inserted into the substrate, the electronic device comes into contact with the heat radiating member, and the heat radiating member is pushed up against an elastic force of the elastic member. In addition, when the electronic device is inserted into a regular position on the substrate, the heat radiating member and the electronic device thermally come into contact with each other, since the heat radiating member is pushed toward the electronic device due to the elastic force of the elastic member.

When the heat radiating member is set to a movable type as described above, there is a restriction in which the heat radiating member has to be small and light-weight in order to secure the movability of the heat radiating member. However, in the small and light-weight heat radiating member, there is a concern that it may be difficult to secure a cooling property of the electronic device when the electronic device is highly efficient and high heat generating, for example.

The followings are reference documents.
[Document 1] Japanese Laid-open Patent Publication No. 2009-152427,
[Document 2] Japanese Laid-open Patent Publication No. 2004-363525, and
[Document 3] Japanese Laid-open Patent Publication No. 2011-159704.

SUMMARY

According to an aspect of the invention, an n electronic apparatus includes a substrate, a heat radiating member which faces the substrate with a gap therebetween, a fixing assembly which fixes the heat radiating member to the substrate, a heat transfer plate disposed on a side of the substrate with respect to the heat radiating member, and a thermal bonding material which is interposed between the heat radiating member and the heat transfer plate, and has elasticity, wherein an electronic device is inserted between the substrate and the heat transfer plate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment
First, a first embodiment of a technology which is disclosed in the application will be described.

Figure 1:
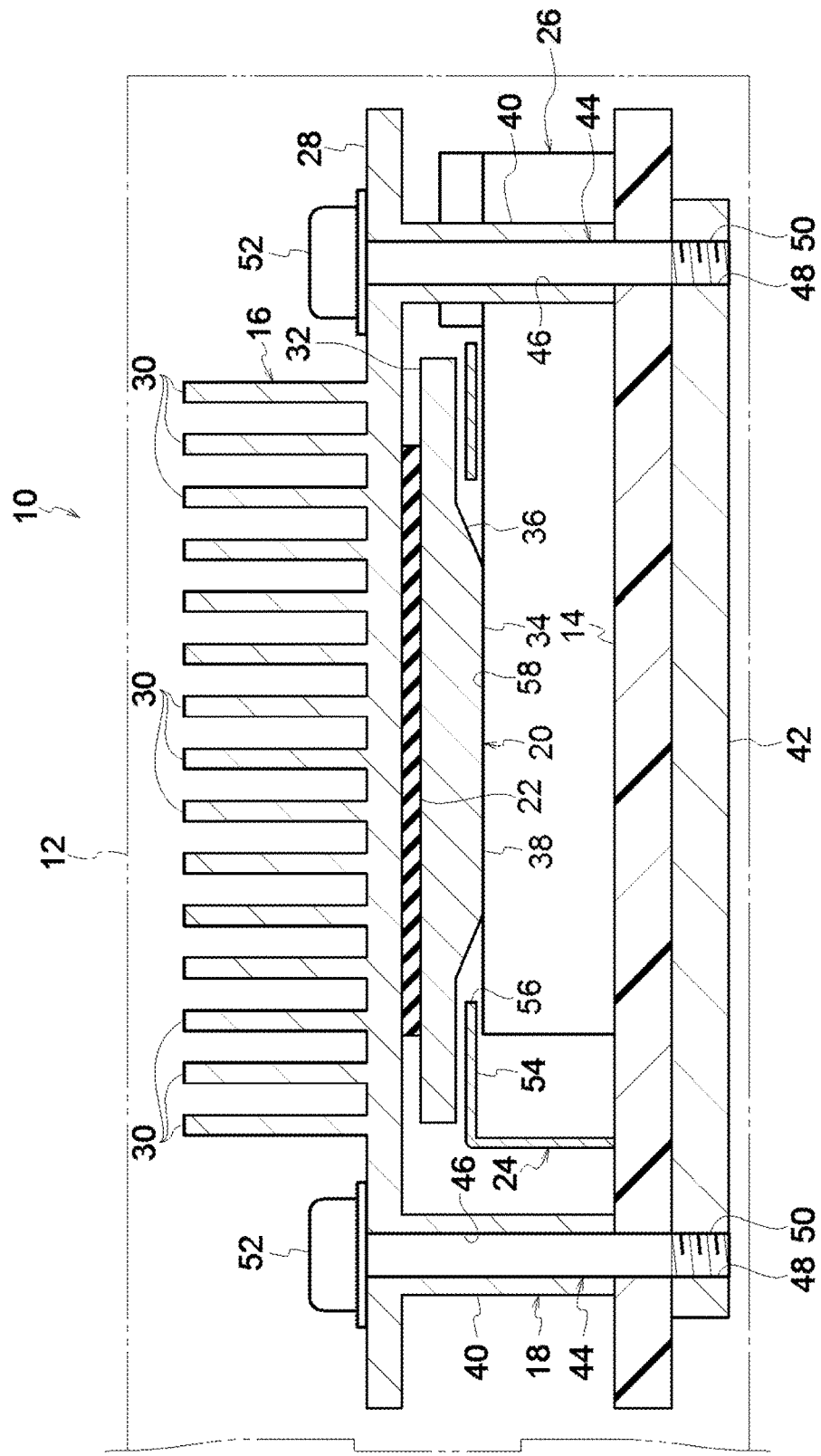
FIG. 1 is a sectional side view in which main portions of an electronic apparatus according to a first embodiment are enlarged.

As illustrated in FIG. 1, an electronic apparatus 10 according to the first embodiment is provided with a housing 12, a substrate 14, a heat radiating member 16, a fixing assembly 18, a heat transfer plate 20, a thermal bonding material 22, a case 24, and an electronic device 26.

The housing 12 is formed in a box shape, and the substrate 14 is accommodated in the housing 12. The substrate 14 is disposed with a height direction of the housing 12 taken as a plate thickness direction.

The heat radiating member 16 is a heat sink, for example, and includes a plate-shaped portion 28, and a plurality of heat radiating fins 30. The plate-shaped portion 28 is disposed with the height direction of the housing 12 taken as a plate thickness direction. The plurality of heat radiating fins 30 extend toward an upper side of the housing 12 in the height direction from the plate-shaped portion 28. The plate-shaped portion 28 of the heat radiating member 16 is disposed above the substrate 14, and faces the substrate 14 with a gap therebetween.

The heat transfer plate 20 is disposed on the side of the substrate 14 with respect to the heat radiating member 16. The heat transfer plate 20 includes a main body portion 32 and a projection 34. The main body portion 32 is formed in a plate shape, and is disposed so as to face the plate-shaped portion 28 of the heat radiating member 16. The main body portion 32 is fixed to the plate-shaped portion 28 of the heat radiating member 16 through a thermal bonding material 22 which will be described later. The projection 34 protrudes toward the substrate 14 from the main body portion 32. An inclined face 36 is formed at the corner of the projection 34. The heat transfer plate 20 is disposed above the substrate 14 with a space therebetween. A tip end face 38 of the projection 34 is formed in a planar shape.

The thermal bonding material 22 is formed in a sheet shape with elasticity. The thermal bonding material 22 is interposed between the heat radiating member 16 and the heat transfer plate 20 in a state of being overlapped with the plate-shaped portion 28 of the heat radiating member 16 and the main body portion 32 of the heat transfer plate 20. The thermal bonding material 22 has a function of, for example, a double sided tape, and fixes the heat transfer plate 20 to the heat radiating member 16. The heat transfer plate 20 moves toward the heat radiating member 16 in a direction facing the heat radiating member 16 in a range in which the thermal bonding material 22 is elastically deformed in a thickness direction. The thermal bonding material 22 is provided in a range overlapped with a region of the heat radiating member 16 in which the plurality of heat radiating fins 30 are disposed in top view.

The fixing assembly 18 fixes the heat radiating member 16 to the substrate 14, and includes a plurality of support portions 40, a fixation plate 42, and a plurality of screws 44. In FIG. 1, two support portions 40 are displayed; however, the number of the plurality of support portions 40 are four, for example, and the plurality of support portions 40 are disposed at the periphery of the heat transfer plate 20. The plurality of support portions 40 extend toward the substrate 14 from the plate-shaped portion 28 of the heat radiating member 16, and support the heat radiating member 16 with respect to the substrate 14 by being disposed between the plate-shaped portion 28 of the heat radiating member 16 and the substrate 14. In addition, the plurality of support portions 40 may be integrally formed in the heat radiating member 16, or may be formed separately from the heat radiating member 16. Through holes 46 which penetrate through the support portions 40 in an axial direction are formed in the plurality of support portions 40, and the plate-shaped portion 28 of the heat radiating member 16.

The fixation plate 42 is overlapped with the substrate 14 on a side of the substrate 14 opposite to the side of the heat radiating member 16. Screw holes 48 are formed in the fixation plate 42 at positions in alignment with the through holes 46. The screws 44 are inserted into the screw holes 48 from one side of the through holes 46. In addition, the plate-shaped portion 28 of the heat radiating member 16, the plurality of support portions 40, and the substrate 14 are interposed by head portions 52 of the screws 44 and the fixation plate 42, when a tip end portion 50 of corresponding one of the screws 44 is screwed to corresponding one of the screw holes 48, and in this manner, the heat radiating member 16 is fixed to the substrate 14.

The case 24 is an example of an "accommodating unit", and is formed in a box shape including a ceiling portion 54. The case 24 is disposed between the heat radiating member 16 and the substrate 14. The ceiling portion 54 of the case 24 is disposed between the heat radiating member 16 and the substrate 14, and more specifically, is disposed between the main body portion 32 of the heat transfer plate 20 and the substrate 14, and faces the main body portion 32 of the heat transfer plate 20. An opening 56 which penetrates through the ceiling portion 54 in a plate thickness direction is formed in the ceiling portion 54, and the projection 34 of the heat transfer plate 20 protrudes toward the inside of the case 24 from the main body portion 32 through the opening 56.

The electronic device 26 is formed in a flat plate shape, and is accommodated in the case 24. When the electronic device 26 is inserted into a space between the substrate 14 and the heat transfer plate 20, the electronic device 26 is interposed between the heat transfer plate 20 and the substrate 14, and the heat transfer plate 20 comes into contact with the electronic device 26, as will be described in detail later. A contact face 58 with the heat transfer plate 20 in the electronic device 26 is in a planar shape.

Subsequently, an operation in which the electronic device 26 comes into contact with the heat transfer plate 20 when the electronic device 26 is inserted into the case 24 will be described in more detail.

Figure 2:
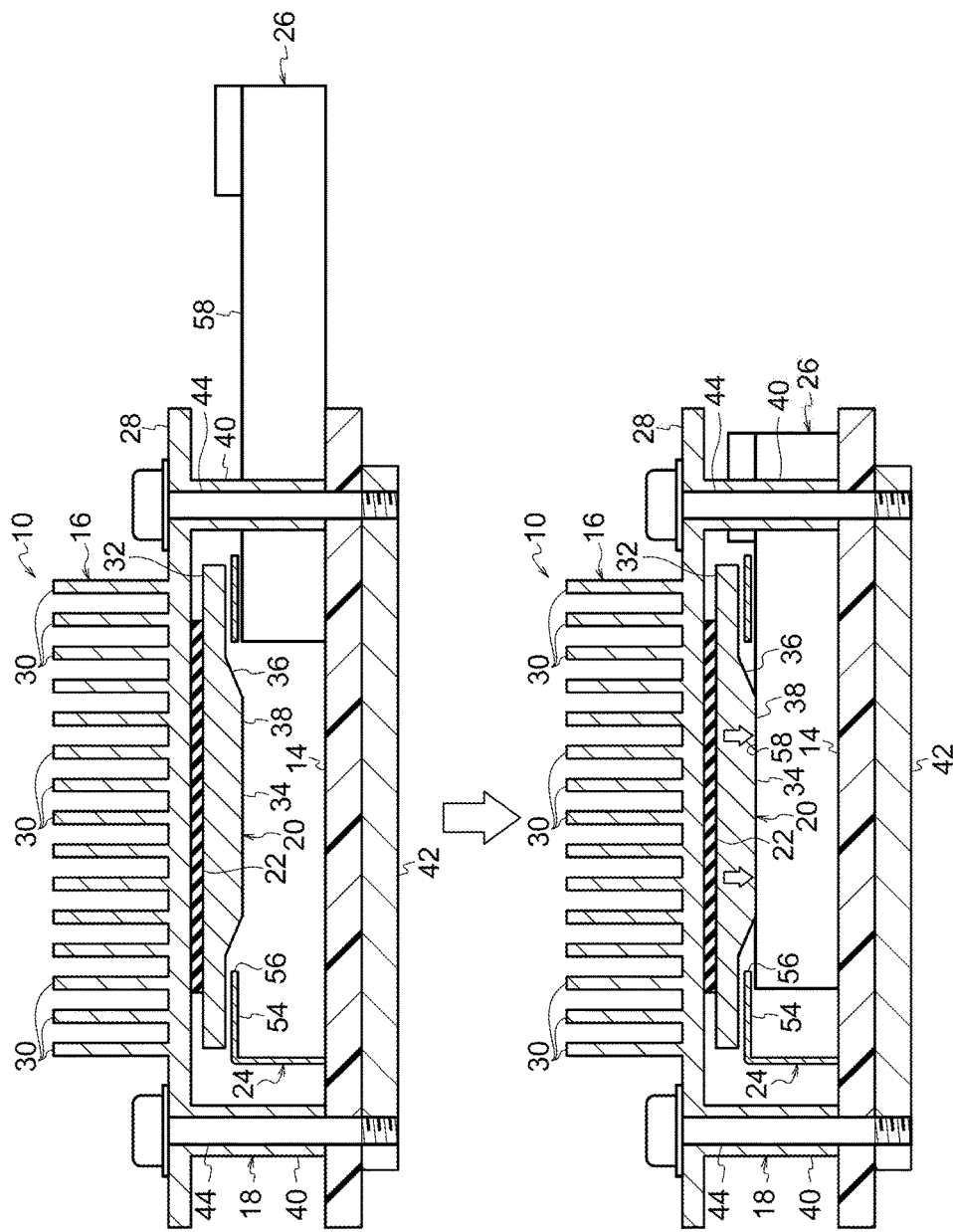
FIG. 2 is a diagram which illustrates a state in which an electronic device is inserted into the electronic apparatus illustrated in FIG. 1.

As illustrated in the upper figure in FIG. 2, the thermal bonding material 22 is not elastically compressed, before the electronic device 26 is inserted into a space in which the electronic device 26 is interposed between the heat transfer plate 20 and the substrate 14 in the inside of the case 24. In this state, the main body portion 32 of the heat transfer plate 20 is overlapped with the ceiling portion 54, and the projection 34 protrudes to the inside of the case 24 through the opening 56.

In addition, when the electronic device 26 is inserted into a space in which the electronic device 26 is interposed between the heat transfer plate 20 and the substrate 14 in the inside of the case 24, the electronic device 26 comes into contact with the inclined face 36 in a sliding manner, and a push-up force toward the heat radiating member 16 acts on the heat transfer plate 20. When the push-up force toward the heat radiating member 16 acts on the heat transfer plate 20, the heat transfer plate 20 is pushed up toward the heat radiating member 16 against an elastic force of the thermal bonding material 22, and the thermal bonding material 22 is compressed in an elastic manner.

In addition, as illustrated in the lower figure in FIG. 2, when the electronic device 26 is inserted into a space in which the electronic device 26 is interposed between the heat transfer plate 20 and the substrate 14 in the inside of the case 24, the heat transfer plate 20 is pressed against the electronic device 26 due to a repulsive force of the thermal bonding material 22. In this manner, the heat transfer plate 20 comes into contact with the electronic device 26 in a state of being pressed against the electronic device 26.

Subsequently, an operation and an effect of the first embodiment will be described.

As described above, according to the electronic apparatus 10 according to the first embodiment, when the electronic device 26 is inserted into a space in which the electronic device 26 is interposed between the heat transfer plate 20 and the substrate 14 in the inside of the case 24, the heat transfer plate 20 is pressed against the electronic device 26 due to the repulsive force of the thermal bonding material 22. Accordingly, since the heat transfer plate 20 comes into contact with the electronic device 26 in a state of being pressed against the electronic device 26, it is possible to suppress a contact thermal resistance between the heat transfer plate 20 and the electronic device 26. In this manner, it is possible to secure a cooling property of the electronic device 26, since it is possible to efficiently transfer heat of the electronic device 26 to the heat radiating member 16 through the heat transfer plate 20 and the thermal bonding material 22.

In addition, the heat radiating member 16 is fixed to the substrate 14 by the fixing assembly 18. Accordingly, since there is no restriction in which the heat radiating member 16 has to be small and light-weight, it is possible to use a member with a highly efficient heat radiating property in the heat radiating member 16. In this manner, it is possible to secure a cooling property of the electronic device 26 even when the electronic device 26 is highly efficient and high heat generating, for example.

In addition, the case 24 which accommodates the electronic device 26 includes the ceiling portion 54 between the heat radiating member 16 and the substrate 14, and the main body portion 32 of the heat transfer plate 20 is disposed between the heat radiating member 16 and the ceiling portion 54. In addition, as illustrated in the upper figure in FIG. 2, for example, the main body portion 32 of the heat transfer plate 20 is overlapped with the ceiling portion 54 in a state before the electronic device 26 is inserted into a space in which the electronic device 26 is interposed between the heat transfer plate 20 and the substrate 14 in the inside of the case 24. Accordingly, since the heat transfer plate 20 is supported by the ceiling portion 54, it is possible to suppress a situation in which the thermal bonding material 22 is separated from the heat radiating member 16, and a situation in which the heat transfer plate 20 is separated from the thermal bonding material 22. In this manner, it is possible to suppress the heat transfer plate 20 falls from the heat radiating member 16 even when the electronic device 26 is not inserted into the case 24.

In addition, the plurality of support portions 40 which support the heat radiating member 16 with respect to the substrate 14 is disposed at the periphery of the heat transfer plate 20. Accordingly, even when the electronic device 26 is inserted into the case 24, and a push-up force acts on the heat radiating member 16 from the heat transfer plate 20, it is possible to bind the heat radiating member 16 with a good balance using the plurality of support portions 40 which are disposed at the periphery of the heat transfer plate 20. In this manner, it is possible to equally press the heat transfer plate 20 against the electronic device 26 by the thermal bonding material 22. As a result, since it is possible to cause the heat transfer plate 20 and the electronic device 26 to be in close contact, equally, it is possible to more effectively suppress the contact thermal resistance between the heat transfer plate 20 and the electronic device 26.

Subsequently, a modification example of the first embodiment will be described.

In the first embodiment, the heat radiating member 16 includes the plurality of heat radiating fins 30; however, the heat radiating member 16 may have a heat radiating structure other than the plurality of heat radiating fins 30.

In addition, in the first embodiment, the heat radiating member 16 is fixed to the substrate 14; however, the heat radiating member may be fixed to the substrate 14 through the housing 12, or the like, for example. That is, the heat radiating member 16 may be directly fixed to the substrate 14, or may be indirectly fixed to the substrate 14, as long as the heat radiating member is fixed to the substrate 14.

In addition, in the first embodiment, the case 24 which accommodates the electronic device 26 is provided on the substrate 14; however, the case 24 may be omitted.

In addition, in the first embodiment, a box-shaped case 24 is used in order to accommodate the electronic device 26; however, an accommodating unit formed in a shape other than the box shape may be used.

In addition, in the first embodiment, the heat transfer plate 20 includes the projection 34; however, the heat transfer plate 20 may be formed in a flat plate shape without the projection 34.

In addition, in the first embodiment, the thermal bonding material 22 is in a sheet shape, preferably; however it may be a shape other than the sheet shape.

In addition, in the first embodiment, the electronic device 26 is set to a constituent element (accessory) of the electronic apparatus 10, as an example; however, the electronic device 26 may not be the constituent element of the electronic apparatus 10.

Second Embodiment

Figure 3:
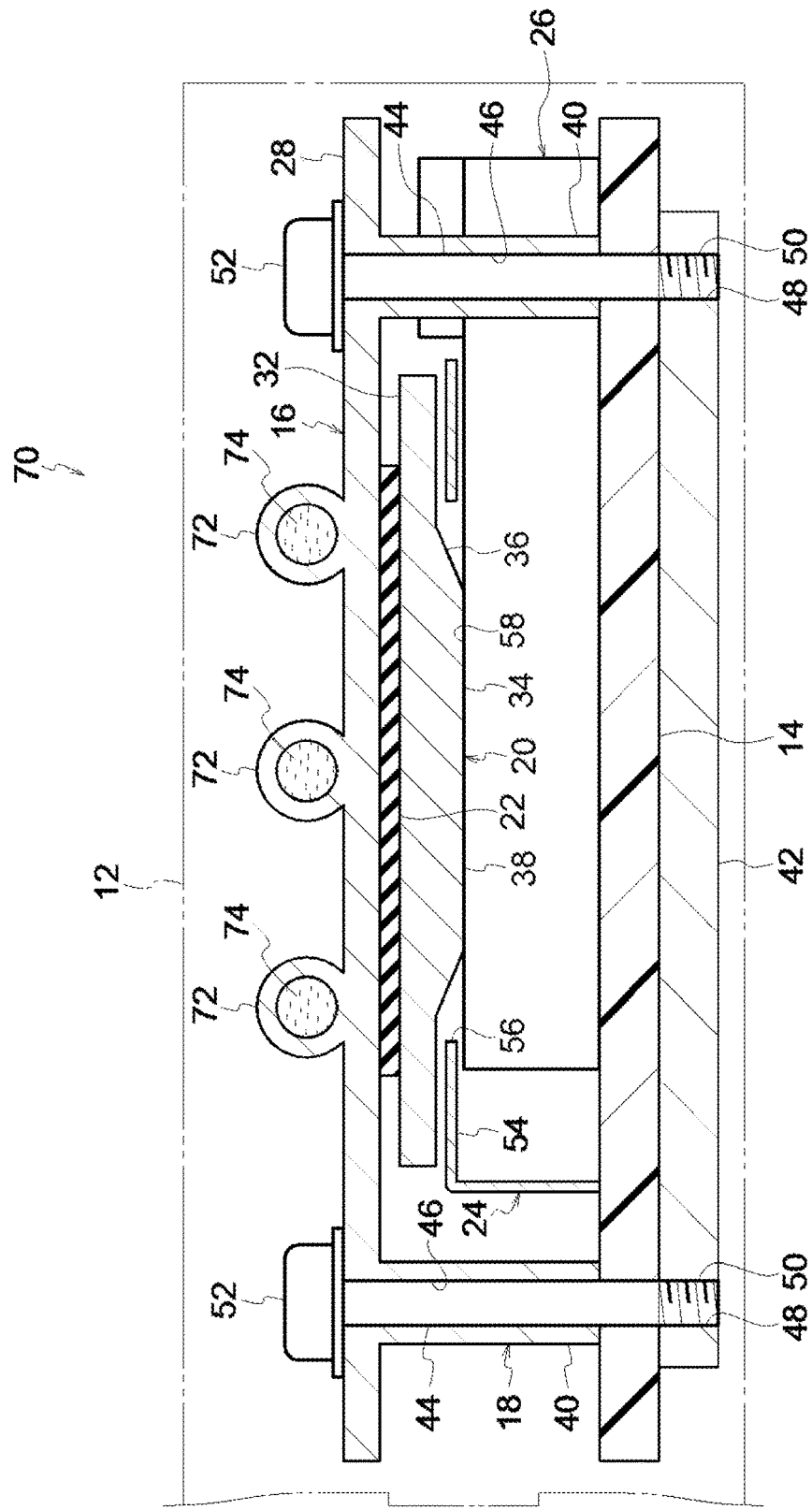
FIG. 3 is a sectional side view in which main portions of an electronic apparatus according to a second embodiment are enlarged.

Subsequently, a second embodiment of the technology which is disclosed in the application will be described. A structure of an electronic apparatus 70 according to the second embodiment which is illustrated in FIG. 3 is changed as follows in comparison with the electronic apparatus 10 according to the above described first embodiment (refer to FIG. 1).

That is, in the electronic apparatus 70 according to the second embodiment, a liquid coolant pipe 72 is provided in the heat radiating member 16, instead of the plurality of heat radiating fins 30 (refer to FIG. 1). The plate-shaped portion 28 of the heat radiating member 16 and the liquid coolant pipe 72 are integrated so as to transfer heat. Liquid coolant 74 circulates inside the liquid coolant pipe 72. The liquid coolant pipe 72 is provided in a range of the heat radiating member 16 overlapped with the thermal bonding material 22 in top view. The electronic apparatus 70 according to the second embodiment has the same configuration as the electronic apparatus 10 of the above described first embodiment, except that the liquid coolant pipe 72 is provided in the heat radiating member 16, instead of the plurality of heat radiating fins 30.

As a comparative example of the second embodiment, it is possible to consider a configuration in which the heat radiating member 16 is movable in a direction facing the substrate 14. However, when the heat radiating member 16 is set to a movable type, it is difficult to connect the liquid coolant pipe 72 and an external liquid coolant feeding device.

Meanwhile, when the heat radiating member 16 is set to a fixed type like the electronic apparatus 70 according to the second embodiment, since it is easy to connect the liquid coolant pipe 72 and the external liquid coolant feeding device, it is possible to mount the liquid coolant pipe 72 on the heat radiating member 16.

In this manner, according to the electronic apparatus 70 in the second embodiment, the liquid coolant pipe 72 is provided in the heat radiating member 16 with the heat radiating member 16 set to the fixed type. Accordingly, it is possible to further improve the heat radiating property of the heat radiating member 16 by causing the liquid coolant 74 to circulate in the liquid coolant pipe 72. In this manner, even when the electronic device 26 is highly efficient and high heat generating, it is possible to improve the cooling property of the electronic device 26.

In addition, also in the electronic apparatus 70 according to the second embodiment, it is possible to adopt the same modification example in the same configuration as that of the electronic apparatus 10 according to the above described first embodiment.

In addition, in the electronic apparatus 70 according to the second embodiment, the heat radiating member 16 may include the heat radiating fins 30 (refer to FIG. 1) which is used in the above described first embodiment, in addition to the liquid coolant pipe 72.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic apparatus comprising:
a substrate;
a heat radiating member which faces the substrate with a first gap therebetween;
a fixing assembly which fixes the heat radiating member to the substrate;
a heat transfer plate disposed on a side of the substrate with respect to the heat radiating member; and a thermal bonding material which is interposed between the heat radiating member and the heat transfer plate, and has elasticity, an electronic device is inserted between the substrate and the heat transfer plate, the heat transfer plate includes a main body portion which is in contact with the thermal bonding material and a projection which protrudes toward the substrate from the main body portion and comes in contact with the electronic device in such a manner that a second gap is provided between a bottom surface of the main body portion and a peripheral portion of the electronic device.

2. The electronic apparatus according to claim 1, wherein a plurality of heat radiating fins are installed in the heat radiating member.

3. The electronic apparatus according to claim 1, wherein a liquid coolant pipe is installed in the heat radiating member.

4. The electronic apparatus according to claim 1, wherein an accommodating unit which accommodates the electronic device is installed in the substrate.

5. The electronic apparatus according to claim 4, wherein the accommodating unit is a box-shaped case which includes a ceiling portion between the heat radiating member and the substrate, wherein the main body portion is disposed between the heat radiating member and the ceiling portion, and wherein the projection protrudes to an inside of the case from the main body portion through an opening formed in the ceiling portion.

6. The electronic apparatus according to claim 1, wherein the fixing assembly includes a plurality of support portions which are disposed at a periphery of the heat transfer plate and support the heat radiating member with respect to the substrate.

7. The electronic apparatus according to claim 1, wherein the heat transfer plate is movable toward the heat radiating member in a direction facing the heat radiating member.

8. The electronic apparatus according to claim 1, wherein the thermal bonding material is in a sheet shape.

9. An electronic apparatus comprising:
a substrate;
a heat radiating member which faces the substrate with a gap therebetween;
a fixing assembly which fixes the heat radiating member to the substrate;
a heat transfer plate disposed on a side of the substrate with respect to the heat radiating member; and
a thermal bonding material which is interposed between the heat radiating member and the heat transfer plate, and has elasticity,
an electronic device is inserted between the substrate and the heat transfer plate,
an accommodating unit which accommodates the electronic device is installed in the substrate,
the accommodating unit is a box-shaped case which includes a ceiling portion between the heat radiating member and the substrate, and wherein the heat transfer plate includes a main body portion disposed between the heat radiating member and the ceiling portion, and a projection which protrudes to an inside of the case from the main body portion through an opening formed in the ceiling portion.

10. The electronic apparatus according to claim 9, wherein a plurality of heat radiating fins are installed in the heat radiating member.

11. The electronic apparatus according to claim 9, wherein a liquid coolant pipe is installed in the heat radiating member.

12. The electronic apparatus according to claim 9, wherein the fixing assembly includes a plurality of support portions which are disposed at a periphery of the heat transfer plate and support the heat radiating member with respect to the substrate.

13. The electronic apparatus according to claim 9, wherein the heat transfer plate is movable toward the heat radiating member in a direction facing the heat radiating member.

14. The electronic apparatus according to claim 9, wherein the thermal bonding material is in a sheet shape.

* * * * *